United States Patent
Chen

(10) Patent No.: US 6,884,554 B2
(45) Date of Patent: Apr. 26, 2005

(54) SEMICONDUCTOR WAFER TILT COMPENSATION BY WAFER ROTATION AND WAFER TILT AVERAGING

(75) Inventor: Chih-Wei Chen, Hsinchu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 60 days.

(21) Appl. No.: 10/640,169

(22) Filed: Aug. 12, 2003

(65) Prior Publication Data

US 2005/0037288 A1 Feb. 17, 2005

(51) Int. Cl.⁷ .............................. G03F 9/00; G03C 5/00; G03B 27/32
(52) U.S. Cl. ........................... 430/22; 430/30; 250/548; 355/39; 355/77
(58) Field of Search ..................... 430/22, 30; 250/548; 355/39, 52, 53, 55, 77; 356/399, 400, 401

(56) References Cited

U.S. PATENT DOCUMENTS 6,704,094 B1 * 3/2004 Chen ............................ 355/55
6,818,365 B1 * 11/2004 Barber ......................... 430/30

* cited by examiner

Primary Examiner—Christopher G. Young
(74) Attorney, Agent, or Firm—Tung & Associates

(57) ABSTRACT

Compensating for semiconductor wafer tilt by rotating the semiconductor wafer and averaging the resulting semiconductor wafer tilts detected is disclosed. The semiconductor wafer has an asymmetrical topography. A first leveling tilt of the semiconductor wafer is detected using a leveling sensor of a stepper. The semiconductor wafer is then effectively or actually rotated, such as by forty-five degrees, ninety-degrees, or one-hundred-eighty degrees. A second leveling tilt of the semiconductor wafer is then detected, again using the leveling sensor of the stepper. The first and the second leveling tilts are averaged to yield an average leveling tilt. The average leveling tilt is then compensated for, by, for instance, oppositely tilting the semiconductor wafer in an effective or actual manner.

20 Claims, 4 Drawing Sheets

SEMICONDUCTOR WAFER TILT COMPENSATION BY WAFER ROTATION AND WAFER TILT AVERAGING

FIELD OF THE INVENTION

This invention relates generally to semiconductor fabrication equipment, and more particularly to monitoring semiconductor wafer tilt on the plates of such equipment.

BACKGROUND OF THE INVENTION

The photolithographic process is one of the most important in semiconductor device fabrication. It transfers the designed pattern from a mask or reticle to photoresist that temporarily coats the wafer surface. A stepper is the most commonly used tool to pattern the photoresist coated on the wafer surface, by exposing the photoresist with ultraviolet (UV) light or deep UV light to induce photochemical reactions. It is usually the most expensive tool in advance semiconductor fabrication foundries as well.

A stepper is more specifically an aligner tool that aligns and exposes one die, or a small number of dies, at a time. The tool steps to each subsequent die on the wafer, until the desired pattern covers the entire wafer. Thus, a step and repeat operation causes a desired semiconductor pattern of a reticle to be transferred to a semiconductor wafer placed on a stage or table, where the reticle pattern is repeatedly imaged over the wafer surface until the entire surface is filled.

FIG. 1 shows an example stepper 100. The stepper 100 can be, for instance, one of those manufactured and sold by ASML, of The Netherlands. Of particular interest is that the stepper 100 has two axes, a q-axis 102 and the p-axis 104. Light from each of the q-axis 102 and the p-axis 104 is directed towards a wafer resting on the wafer table 106. Offset plane plates 108 and 110 can be tilted to effectively introduce a tilt of the wafer resting on the wafer table 106, in either or both of the two axes 102 and 104, respectively. That is, tilting the offset plane plates 108 and 110 is effectively the same as tilting the wafer resting on the wafer table 106. The terminology semiconductor wafer tilt as used herein encompasses both such effective wafer tilt as well as actual wafer tilt.

Furthermore, the quad cells 112 and 114 determine which part of the semiconductor pattern being imaged is projected onto which part of the semiconductor wafer resting on the wafer table 106. Thus, rather than physically rotating the wafer resting on the wafer table 106, the quad cells 112 and 114 can instead be appropriately manipulated to cause the same effect as such rotation, which is encompassed under the terminology effective semiconductor wafer rotation as used herein. The terminology semiconductor wafer rotation as used herein encompasses both actual and effective wafer rotation. FIG. 2 shows the path 200 of a white light beam as it is projected through either of the quad cells 112 and 114 of the stepper 100 of FIG. 1, as can be appreciated by those of ordinary skill within the art.

One difficulty with steppers, such as the stepper 100, relates to semiconductor patterns that have asymmetrical topography. The leveling sensor detects the height difference of the asymmetrical topography. The leveling system then compensates for the topographical height difference between the areas of dense pattern density and sparse pattern density by actually or effectively inclining the plane of the stage on which the wafer rests, thereby inducing wafer tilt. For instance, such wafer tilt may be effectively induced by rotating the offset plane plates 108 and 110 for the q-axis 102 and the p-axis 104, respectively, of the stepper 100 of FIG. 1.

Wafer tilt, however, can cause asymmetrical field-related defocus. More specifically, within in the second metal layer of certain semiconductor patterns, such as certain semiconductor memory-related patterns, the photoresist profile may be rounded on one side or the other, causing less than desirable photolithographic imaging, which can affect the ultimate quality of the semiconductor devices being fabricated. Current solutions to this problem center on simulating the semiconductor wafer tilt and correcting the wafer tilt within the stepper itself.

However, attempting to simulate the wafer tilt can be difficult to accomplish. Moreover, correcting the wafer tilt within the stepper can undesirably increase semiconductor fabrication processing times. Both of these can increase the cost of fabricating semiconductor devices, particularly semiconductor memories. This can negatively affect the semiconductor foundry where the fabrication occurs. This is especially the case for semiconductor memories, where profit margins are relatively low.

Therefore, there is a need for correcting semiconductor wafer tilt induced by the leveling sensors of steppers. More specifically, there is a need for correcting such semiconductor wafer tilt that results when imaging photolithographic patterns having asymmetrical topographies onto semiconductor wafers. For these reasons, as well as other reasons, there is a need for the present invention.

SUMMARY OF THE INVENTION

The invention relates to compensating for semiconductor wafer tilt by rotating the semiconductor wafer and averaging the resulting semiconductor wafer tilts detected. The semiconductor wafer has an asymmetrical topography. A mask pattern is projected through a projection lens of a leveling sensor on the semiconductor wafer to form a first image field. Under the projection lens, a second image field identical to the first image field is formed. Trapezoidal beams are projected on the four corners of the first image field, such as P1, P2, Q1, and Q2 trapezoidal beams. Trapezoidal beams are also projected on the four corners of the second image field, such as P1, P2, Q1, and Q2 trapezoidal beams.

A P receiving component of the leveling sensor can then be used to receive from the first image field the reflected P1 and P2 trapezoidal beams, and from the second image field, the reflected P1 and P2 trapezoidal beams, obtaining data. Concurrently, a Q receiving component of the leveling sensor can be used to receive from the first image field the reflected Q1 and Q2 trapezoidal beams, and from the second image field, the reflected Q1 and Q2 trapezoidal beams, also obtaining data. A first leveling tilt is then determined based on the data that has been obtained, that is, based on the reflected trapezoidal beams.

The semiconductor wafer is then rotated, such as effectively by rotating the P receiving component and the Q receiving component, preferably one-hundred eighty degrees. The P receiving component is again used to receive from the first and the second image fields, the reflected P1 and P2 trapezoidal beams, yielding additional data, and the Q receiving component is again used to received from the first and the second image fields, the reflected Q1 and Q2 trapezoidal beams, also yielding additional data. A second leveling tilt is then determined based on the data that has been obtained, that is, based on the reflected trapezoidal beams as the semiconductor wafer has been rotated or effectively rotated. The first and the second leveling tilts are averaged to obtain the optimal leveling tilt for the wafer for use in photolithographic fabrication processes, and the tilt of the semiconductor wafer is compensated for.

Embodiments of the invention provide for advantages over the prior art. By determining the leveling tilt detected by the leveling sensor, rotating the wafer, and then determining the leveling tilt again, an average leveling tilt can be determined. Compensating for this average leveling tilt, instead of just compensating for the initial leveling tilt detected, reduces leveling tilt-related problems, such as field-related defocus. Furthermore, this solution is easier to perform than simulating the leveling tilt, as is accomplished within the prior art. Still other advantages, aspects, and embodiments of the invention will become apparent by reading the detailed description that follows, and by referring to the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
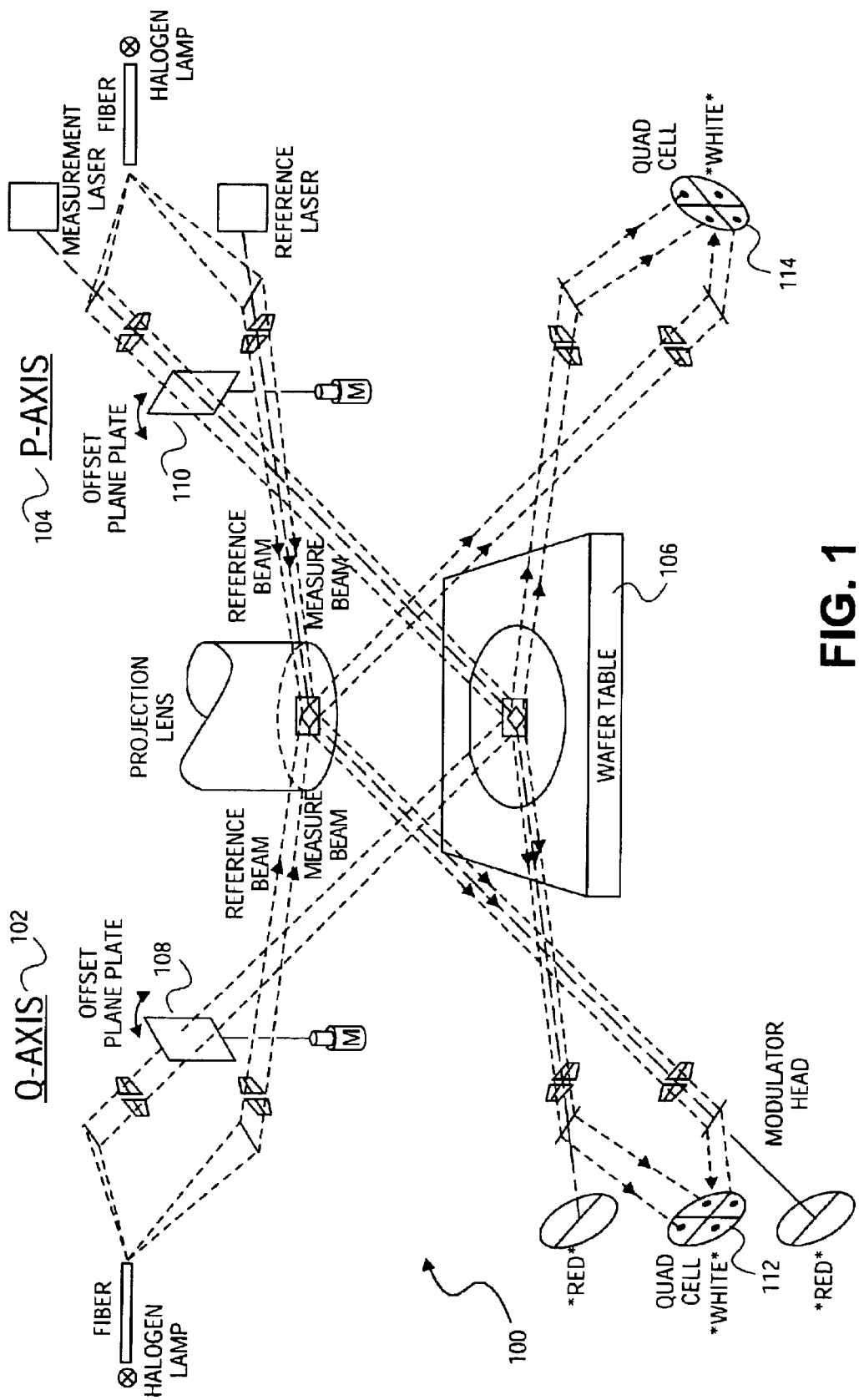
FIG. 1 is a diagram of an example stepper in conjunction with which embodiments of the invention may be implemented.
Figure 2:
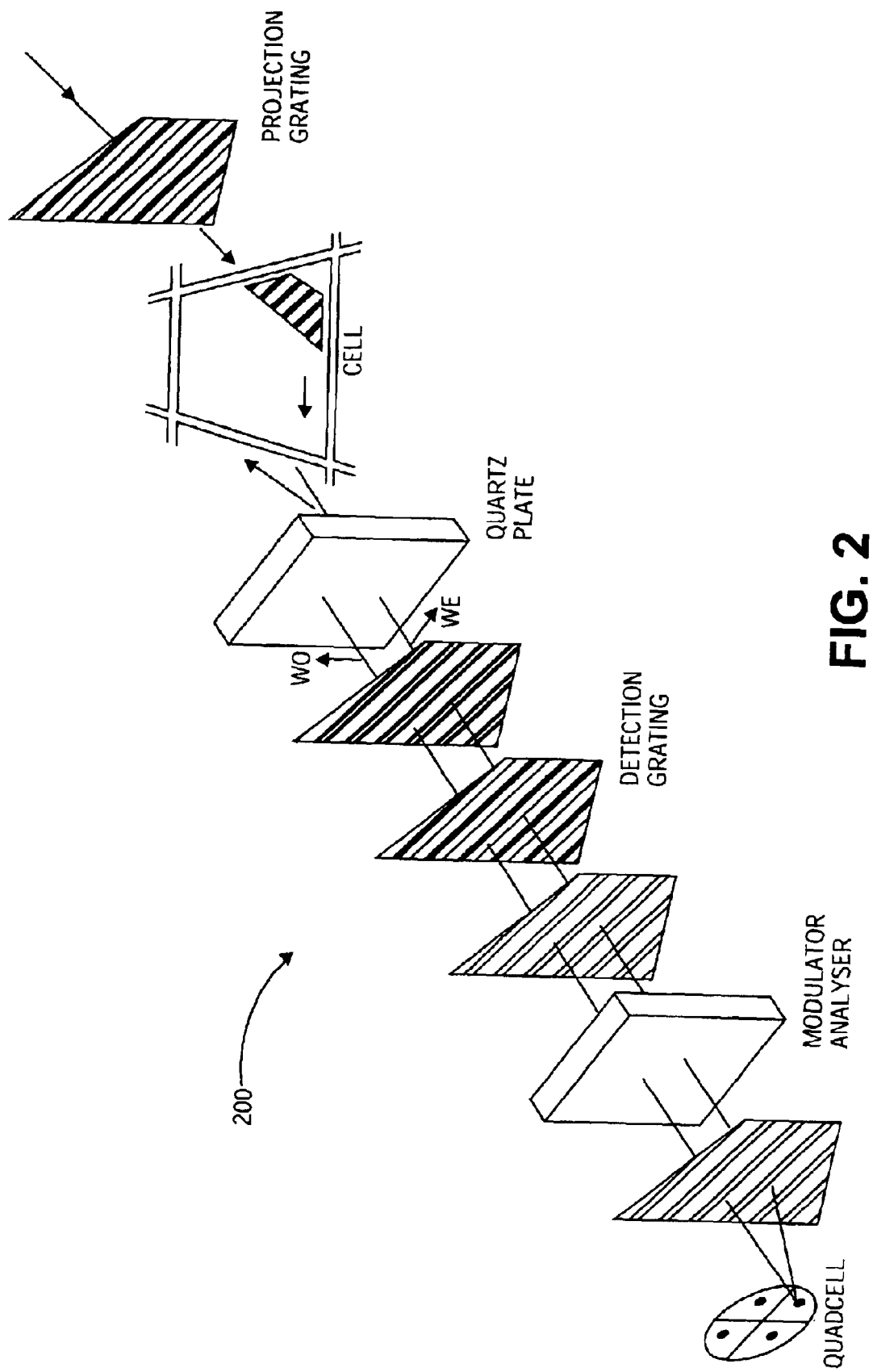
FIG. 2 is a diagram showing as an example the path of a white light beam projected within the stepper of FIG. 1.
Figure 3:
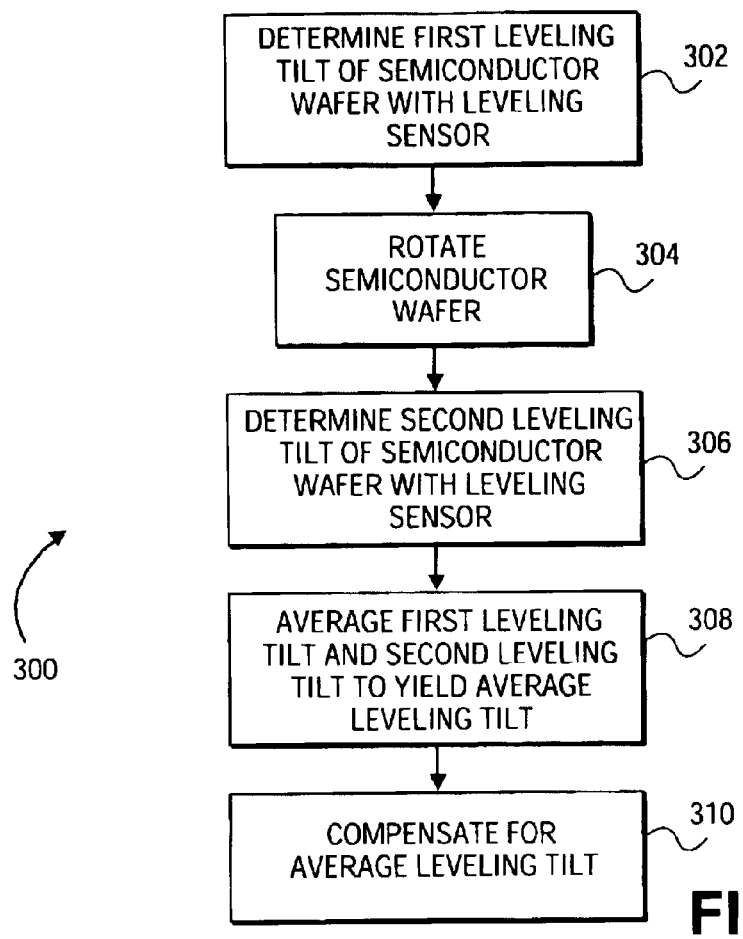
FIG. 3 is a flowchart of a method for correcting or compensating for leveling tilt of a semiconductor wafer having an asymmetrical topography, according to an embodiment of the invention.
Figure 4:
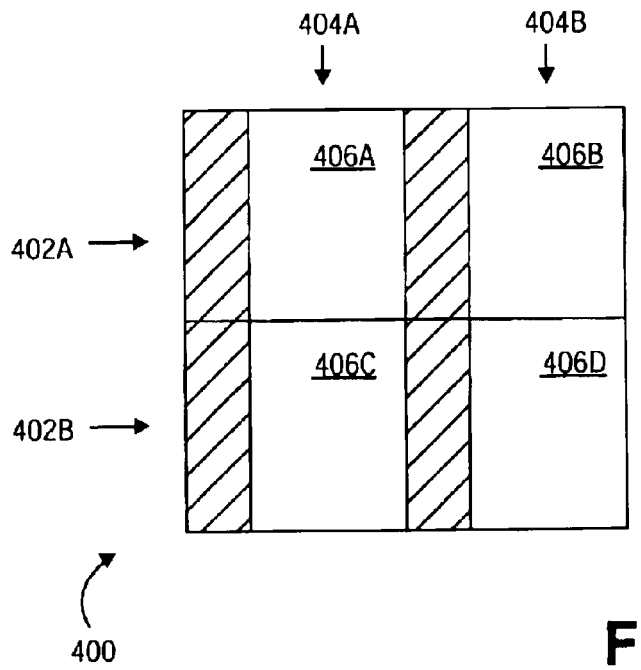
FIG. 4 is a diagram of an example semiconductor wafer having an example asymmetrical topography, in conjunction with which embodiments of the invention may be practiced.

FIG. 3 shows a method 300 for compensating for semiconductor wafer tilt, according to an embodiment of the invention. First, a first leveling tilt of the semiconductor wafer is determined, using a leveling sensor of a stepper (302). The stepper may be that shown in and described in conjunction with FIGS. 1 and 2, as well as other types of steppers. The semiconductor wafer has an asymmetrical topography. FIG. 4 shows an example semiconductor wafer 400 that has an asymmetrical topography. However, other types of wafers, having other types of asymmetrical topography, are also amenable to the invention.

In FIG. 4, the wafer 400 is a two die-by-two die wafer, having dies along the columns 404A and 404B and along the rows 402A and 402B, as the dies 406A, 406B, 406C, and 406D. In general, the leveling tilt is greater for the number of dies on the wafer. Thus, a three die-by-three die wafer has greater wafer tilt than a two die-by-two die wafer, a four die-by-four die wafer has greater tilt than a three die-by-three die wafer, and so on. The wafer 400 specifically has dense patterns in the shaded regions, and iso, non-dense patterns in the non-shaded, blank regions. Since the dense patterns are not symmetrically arranged on the wafer 400, it is said that the semiconductor wafer 400 has an asymmetrical topography. That is, the dense patterns are asymmetrically arranged on the semiconductor wafer 400.

Figure 5:
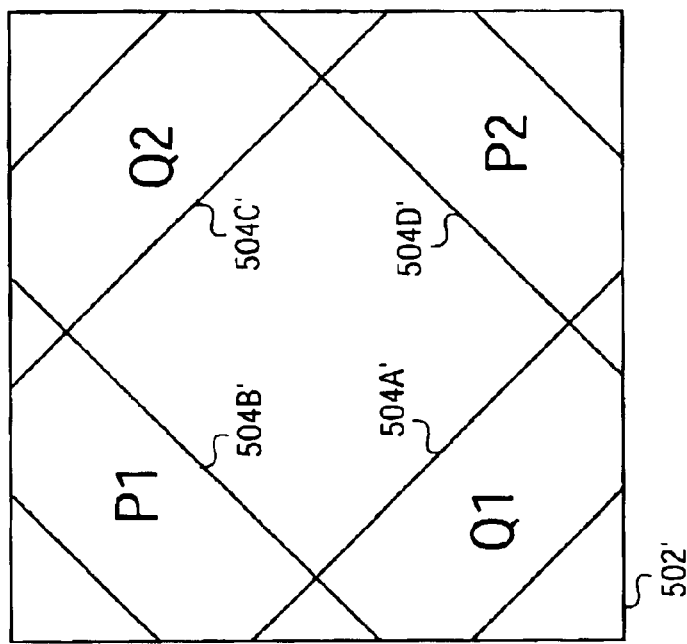
FIG. 5 is a diagram showing how a semiconductor wafer can be rotated one-hundred-eighty degrees along a plane defined by the p- and q-axes of a stepper, according to an embodiment of the invention.
Figure 5:
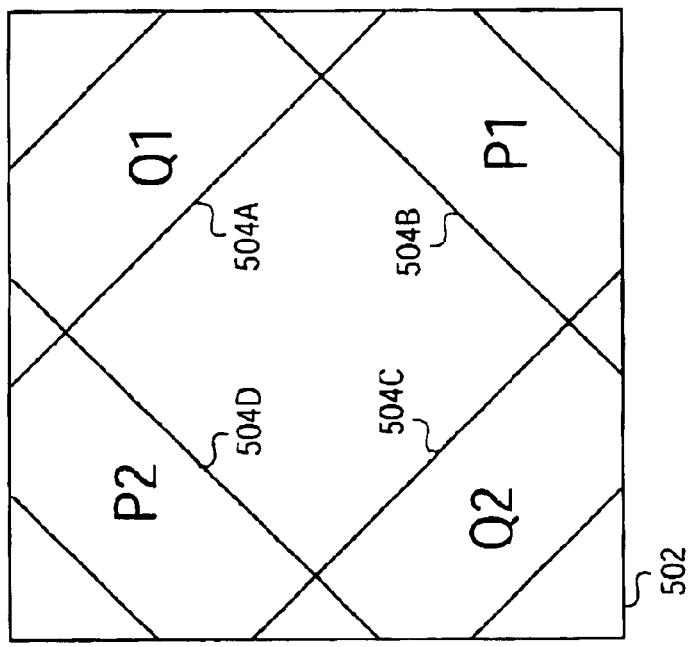

Referring back to FIG. 3, the semiconductor wafer is next rotated (304). Rotation may be forty-five degrees, ninety degrees, or one-hundred-eighty degrees, for instance. Rotation may be accomplished either actually or effectively. For instance, rotation may be accomplished by rotating the quad cells of the stepper to achieve effective wafer rotation. For actual wafer rotation, either the semiconductor wafer or the table or stage of the stepper on which the wafer rests may be rotated. FIG. 5 shows an example one-hundred-eighty degree rotation 500. However, other types of rotation, including other types of one-hundred-eight degree rotation, may also be utilized in the invention.

In FIG. 5, the original wafer configuration 502 is aligned along the axes 504A, 504B, 504C and 504D as shown in the figure. That is, the Q1 axis 504A is in the upper right-hand corner, the P1 axis 504B is in the lower right-hand corner, the P2 axis 504D is in the upper left-hand corner, and the Q2 axis 504C is in the lower left-hand corner. By using actual or effective semiconductor wafer rotation, as indicated by the arrow 506, the resulting original wafer configuration 502' is aligned along the axes 504A', 504B', 504C', and 504D' as shown in the figure. That is, the Q1 axis 504A' is now in the lower left-hand corner, whereas the Q2 axis 504C' is in the upper right-hand corner, one-hundred-eighty degrees as compared to their counterparts 504A and 504C. Similarly, the P1 axis 504B' is in the upper left-hand corner, and the P2 axis 504D' is in the lower right-hand corner, one-hundred-eighty degrees as compared to their counterparts 504B and 504D.

Referring back to FIG. 3, a second leveling tilt of the semiconductor wafer is determined, again using the leveling sensor of the stepper (306). Whereas the first wafer tilt was determined with the wafer in position prior to rotation, the second wafer tilt is determined with the wafer in position after rotation. The two wafer tilts are then averaged to yield an average leveling tilt (308). This average semiconductor wafer tilt can then be compensated for (310), by, for instance, effectively or actually tilting the semiconductor wafer to cancel the average leveling tilt determined. For instance, offset plane plates of the stepper may be tilted to effectively tilt the semiconductor wafer, or the wafer itself or the stage or table on which it rests may be tilted to actually tilt the semiconductor wafer.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:
projecting a mask pattern through a projection lens within a leveling sensor on a semiconductor wafer to form a first image field, such that under the projection lens a second image field is formed identical to the first image field;
projecting on corners of the first image field a plurality of first beams;
projecting on corners of the second image field a plurality of second beams;
determining a first leveling tilt of a semiconductor wafer having an asymmetrical topography using the leveling sensor, based on the plurality of first beams and the plurality of second beams;
rotating the semiconductor wafer;
determining a second leveling tilt of the semiconductor wafer using the leveling sensor, based on the plurality of first beams and the plurality of second beams on the corners of the first and the second image fields after the semiconductor wafer has been rotated;
averaging the first leveling tilt and the second leveling tilt to yield an average leveling tilt; and,
compensating for the average leveling tilt.

2. The method of claim 1, wherein rotating the semiconductor wafer comprises effectively rotating the semiconductor wafer in lieu of actually rotating the semiconductor wafer.

3. The method of claim 2, wherein effectively rotating the semiconductor wafer comprises rotating quad cells.

4. The method of claim 1, wherein rotating the semiconductor wafer comprises actually rotating the semiconductor wafer.

5. The method of claim 4, wherein actually rotating the semiconductor wafer comprises rotating a table on which the semiconductor wafer rests.

6. The method of claim 1, wherein rotating the semiconductor wafer comprises rotating the semiconductor wafer one of forty-five degrees, ninety-degrees, and one-hundred-eighty degrees.

7. The method of claim 1, wherein rotating the semiconductor wafer comprises rotating the semiconductor wafer one-hundred-eighty-degrees.

8. The method of claim 1, wherein compensating for the average leveling tilt comprises tilting the semiconductor wafer.

9. The method of claim 8, wherein tilting the semiconductor wafer in lieu of actually tilting the semiconductor wafer.

10. The method of claim 9, wherein effectively tilting the semiconductor wafer comprises tilting offset plane plates.

11. The method of claim 8, wherein inclining the plane of the semiconductor wafer comprises actually tilting the semiconductor wafer.

12. The method of claim 11, wherein actually tilting the semiconductor wafer comprises tilting a table on which the semiconductor wafer rests.

13. A method comprising:
projecting a mask pattern through a projection lens within a leveling sensor on a semiconductor wafer to firm a first image field, such that under the projection lens a second image field is formed identical to the first image field;
projecting a plurality of beams on corners of the first and the second image fields;
determining a first leveling tilt of a semiconductor wafer having an asymmetrical topography using the leveling sensor, based on the plurality of beams;
rotating the semiconductor wafer one-hundred-eighty degrees;
determining a second leveling tilt of the semiconductor wafer using the level sensor, based on the plurality of beams on the corners of the first and the second image fields after the semiconductor wafer has been rotated;
averaging the first leveling tilt and the second leveling tilt to yield an average leveling tilt; and,
tilting the semiconductor wafer to compensate for the average leveling tilt.

14. The method of claim 13, wherein rotating the semiconductor wafer comprises effectively rotating the semiconductor wafer by rotating quad cells.

15. The method of claim 13, wherein rotating the semiconductor wafer comprises actually rotating the semiconductor wafer by rotating a table on which the semiconductor wafer rests.

16. The method of claim 13, wherein tilting the semiconductor wafer comprises effectively tilting the semiconductor wafer by tilting offset plane plates.

17. The method of claim 13, wherein tilting the semiconductor wafer comprises actually tilting the semiconductor wafer by tilting a table on which the semiconductor wafer rests.

18. A method comprising:
projecting a mask pattern through a projection lens within a leveling sensor on a semiconductor wafer to form a first image field, such that under the projection lens a second image field is formed identical to the first image field;
projecting on corners of the first and the second image fields a plurality of beams;
determining a first leveling tilt of a semiconductor wafer having an asymmetrical topography using the leveling sensor, based on the plurality of beams;
rotating the semiconductor wafer one-hundred-eighty degrees;
determining a second leveling tilt of the semiconductor wafer using the level sensor, based on the plurality of beams on the corners of the first and the second image fields after the semiconductor wafer has been rotated;
averaging the first leveling tilt and the second leveling tilt to yield an average leveling tilt; and,
effectively tilting the semiconductor wafer to compensate for the average leveling tilt.

19. The method of claim 18, wherein rotating the semiconductor wafer comprises effectively rotating the semiconductor wafer.

20. The method of claim 18, wherein effectively tilting the semiconductor wafer comprises tilting offset plane plates.

* * * * *